(12) United States Patent
Kim et al.

(10) Patent No.: US 6,314,038 B1
(45) Date of Patent: Nov. 6, 2001

(54) SEMICONDUCTOR MEMORY DEVICE FOR REDUCING PARASITIC RESISTANCE OF THE I/O LINES

(75) Inventors: Jae-Woon Kim; Jong-Hoon Park, both of Kyoungki-do (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/754,119

(22) Filed: Jan. 5, 2001

(30) Foreign Application Priority Data

May 6, 2000 (KR) .................................................. 00-24201

(51) Int. Cl.[7] ..................................................... G11C 7/00

(52) U.S. Cl. .................... 365/203; 365/207; 365/189.01; 365/189.09; 365/230.06

(58) Field of Search .................................... 365/203, 207, 365/189.01, 189.09, 191, 230.03, 230.06

(56) References Cited

U.S. PATENT DOCUMENTS 5,995,431 * 11/1999 Inui et al. .............................. 365/203

* cited by examiner

*Primary Examiner*—David Nelms
*Assistant Examiner*—David Lam
(74) *Attorney, Agent, or Firm*—Morgan, Lewis & Bockius LLP (57) ABSTRACT

A semiconductor memory includes a memory cell array including a plurality of memory cells, wherein each of the plurality of memory cells outputs a first data signal through an I/O line; an I/O line driving circuit for generating a second data signal by amplifying the first data signal, wherein the I/O line driving circuit is connected to the I/O lines; a data bus driving circuit connected to the I/O line driving circuit to generate a third data signal by amplifying the second data signal; a data bus precharge circuit; and a data bus connecting the data bus driving circuit to the data bus precharge circuit, wherein the data bus precharge circuit precharges the data bus to a predetermined voltage level before the third data signal is generated and transfers a voltage of the data bus to high or low level in accordance with a logic value of the third data signal when the third data signal is generated.

17 Claims, 6 Drawing Sheets

SEMICONDUCTOR MEMORY DEVICE FOR REDUCING PARASITIC RESISTANCE OF THE I/O LINES

This application claims the benefit of Korean Patent Application No. 2000-24201 filed on May 6, 2000, which is hereby incorporated by reference.

BACKGROUND OF THE INVENTION

1. Field of the Invention

The present invention relates to a semiconductor memory, particularly, to a data output path of a semiconductor memory. Although the present invention is suitable for a wide scope of applications, it is particularly suitable for a semiconductor memory device for reducing parasitic capacitance or resistance of the I/O line.

2. Discussion of the Related Art

An I/O (input/output) line transferring data signals that is amplified by a bit line sense amplifier located outside of a cell array has to send the data signals to a specific data output pad, thereby resulting in a long path that reduces its operating speed. Thus, a method of arranging an I/O line to reduce parasitic capacitance or resistance of the I/O line is required.

A method of making the I/O line having a hierarchical structure is widely used for the arrangement of the I/O line. In the hierarchical structure of the I/O line, a path from a memory cell to a data output buffer is hierarchic and a data signal is amplified gradually by placing a sense amplifier at each hierarchy.

Namely, the I/O line having the hierarchical structure amplifies the data signal, which has been amplified by the bit line sense amplifier, through the I/O line and an I/O line sense amplifier, and then amplifies an output of the I/O line sense amplifier again through a data bus and a data bus sense amplifier.

Figure 1:
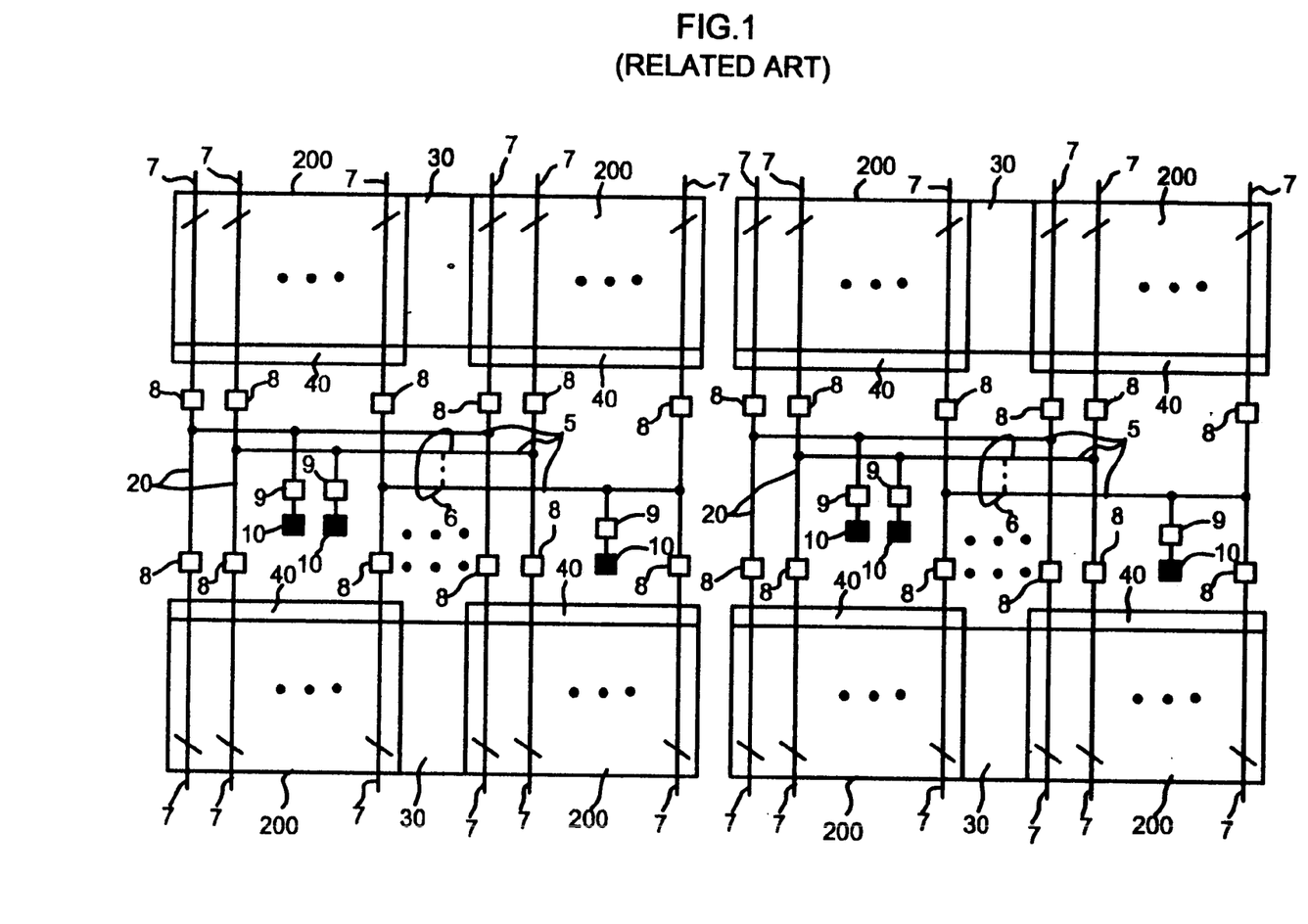
FIG. 1 is a block diagram of a semiconductor memory according to a related art.

FIG. 1 shows a block diagram of a semiconductor memory according to a related art, specifically illustrating the hierarchically structured I/O line, explained in the above description.

The related art shown in FIG. 1 is disclosed in U.S. Pat. No. 5,657,265 (FIG. 2) which is hereby incorporated by reference in its entirety. The construction of FIG. 1 will be explained in the following description by referring to the contents taught by U.S. Pat. No. 5,657,265.

Referring to FIG. 1, a semiconductor memory of the related art includes a plurality of memory cell array blocks 200. Each row decoder 30, formed between two memory cell array blocks, controls a word line of a memory cell array block. A column decoder 40 is arranged respectively to the central direction of a memory cell array block chip to limit a maximum length of a data path of an I/O line 7 arranged vertically. A pair of memory cell array blocks 200 adjacent to each other are arranged near about the center of the chip so that they co-own at least a row decoder 30. Each of the memory cell array blocks 200 confronting each other at the center of the chip has an independent data output pad.

An I/O switch/driver 8 connected to the respective I/O lines comprises a switch device enabled during reading data and an I/O driver enabled during writing data. The I/O switch/drivers 8 formed at corresponding places of the memory cell array blocks confronting each other are connected to a first data line 20. The first data line 20 is connected to a data sense amplifier 9, which is connected to a data I/O buffer/output pad 10. In order to read or write data simultaneously, a semiconductor memory, such as a synchronous DRAM, pursuing high data transmission bandwidth requires a memory cell array with increased number of I/O lines. As a result, the number of I/O control circuits such as I/O sense amplifiers and I/O drivers are increased in accordance with the increase in the number of I/O lines.

In the such a semiconductor memory according to the related art, data signals outputted from at least four memory cell array blocks are transferred to a data sense amplifier through at least four I/O switches and drivers and a data line, which minimizes the data input/output difference between the I/O switch and the I/O driver. However, the load on the data line is too much since the outputs from the at least four I/O switches and I/O drivers are transferred through the one data line to the data sense amplifier.

Further, the long data line connecting the respective I/O drivers to the output buffer/pad results in increased load. As a result, high speed operation of a semiconductor memory may be prevented since excessive amount of data which requires overtime for driving the data line is loaded on the data line.

SUMMARY OF THE INVENTION

Accordingly, the present invention is directed to a semiconductor memory that substantially obviates one or more of the problems due to limitations and disadvantages of the related art.

The object of the present invention is to provide a semiconductor memory which promptly transfers a data bus signal to high or low level as soon as output of a data signal occurs.

Another object is to provide a semiconductor memory capable of high speed operation.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes a memory cell array, an I/O line driving circuit, a data bus driving circuit, and a data bus precharge circuit. The memory cell array includes a plurality of memory cells, and outputs a first data signal of the respective memory cells through an I/O line. The I/O line driving circuit generates a second data signal by amplifying the first data signal and is installed in the I/O line. The data bus driving circuit is connected to the I/O line driving circuit to generate a third data signal by amplifying the second data signal. The data bus connects the data bus driving circuit to a data output buffer electrically. The data bus recharge circuit precharges the data bus at a predetermined voltage level before the generation of the third data signal, and transfers the voltage of the data bus to high or low level in accordance with a logic value of the third data signal once the third data signal is generated.

In another aspect, the present invention includes a memory cell array, an I/O line driving circuit, a data bus precharge circuit, a data bus, and a data bus driving circuit. The memory cell array includes a plurality of memory cells and outputs a first data signals of the respective memory cells through an I/O line. The I/O line driving circuit generates a second data signal by amplifying the first data signal. The data bus precharge circuit precharges the data bus to a predetermined voltage level before the generation of the second data signal and transfers the voltage of the data bus to high or low level in accordance with a logic value of the second data signal once the second data signal is generated. The data bus connects the data bus precharge circuit to a data output buffer electrically. The data bus driving circuit generates a third data signal by amplifying a data signal outputted from the data bus precharge circuit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 2:
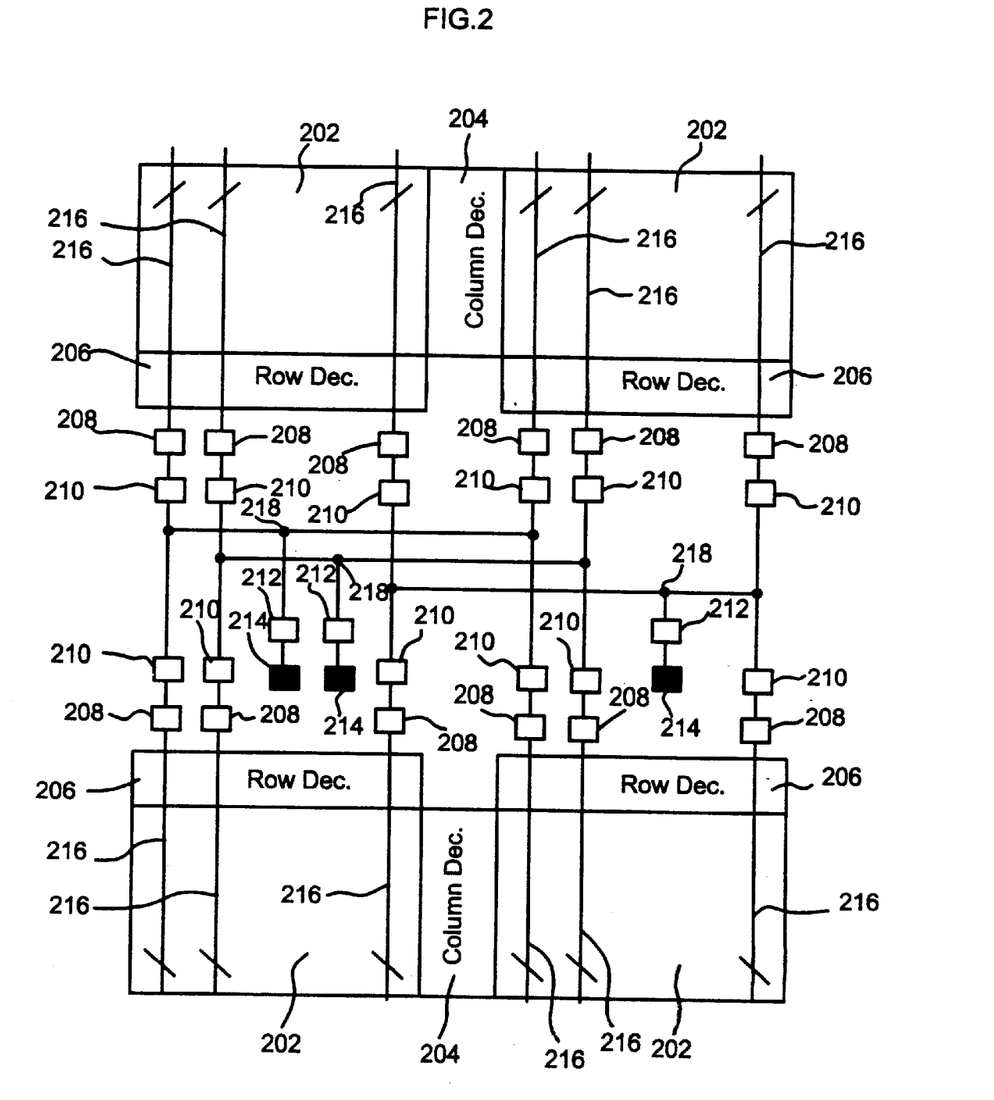
FIG. 2 is a block diagram of a semiconductor memory according to a first embodiment of the present invention.

FIG. 2 shows a block diagram of a semiconductor memory according to an embodiment of the present invention. The semiconductor memory of FIG. 2 shows four memory cell arrays 202. Each of the memory cell arrays 202 includes a row decoder 206, and a pair of memory cell arrays adjacent to each other and co-owns a column decoder 204 which selects a corresponding bit line (not shown in the drawing) of the respective memory cell arrays 202 by decoding an inputted column address.

The memory cell array 202 is constructed with a plurality of memory cells. One of the memory cells is selected by the column decoder 204 and the row decoder 206. A data signal of the selected memory cell is transferred to an I/O line 216 through a bit line. Each of the I/O lines 216 is connected to each of I/O line sense amplifiers 208. The I/O line sense amplifier 208 connects or disconnects the I/O line 216 to or from the data bus sense amplifier 210 electrically and amplifies the data signal of the I/O line 216 primarily.

The data bus sense amplifiers 210 are connected to the I/O line sense amplifiers 208, respectively. The data bus sense amplifiers 210 amplifies the data signal that has been amplified primarily by the I/O line sense amplifier 208. An output of the data bus sense amplifiers 210 is transferred to a data bus precharge circuit 212 through the data bus 218. An output of the data bus sense amplifier 210 and the I/O line sense amplifier 208, which are connected to the I/O line 216, which a data signal of the bit line of the same address in the respective memory cell arrays 202, is transferred to the data bus precharge circuit 212 through the data bus 218. Output of the four data bus sense amplifiers 210 co-owns one data bus 218.

The data bus precharge circuits 212 are supplied with data signals through the data buses 218. Once a precharge signal PRE is generated from the data bus sense amplifier 210 before the occurrence of the data signal, the data bus precharge circuit 212 precharges the data bus 218 to the level of VDD/2. Once an output of the data signal is generated from the data bus sense amplifier 210, the data bus precharge circuit 212 transfers the voltage of the data bus 218 to high or low level in accordance with the level of the data signal. Moreover, the data bus precharge circuit 212 latches the logic value of the previous data signal until a new data signal is inputted. A data output buffer/pad 214 is constructed with a data output buffer and a data output pad. The data output buffer/pad 214 amplifies the data signal outputted from the data bus precharge circuit 212 to an external chip voltage level to be outputted outside the chip.

Figure 3:
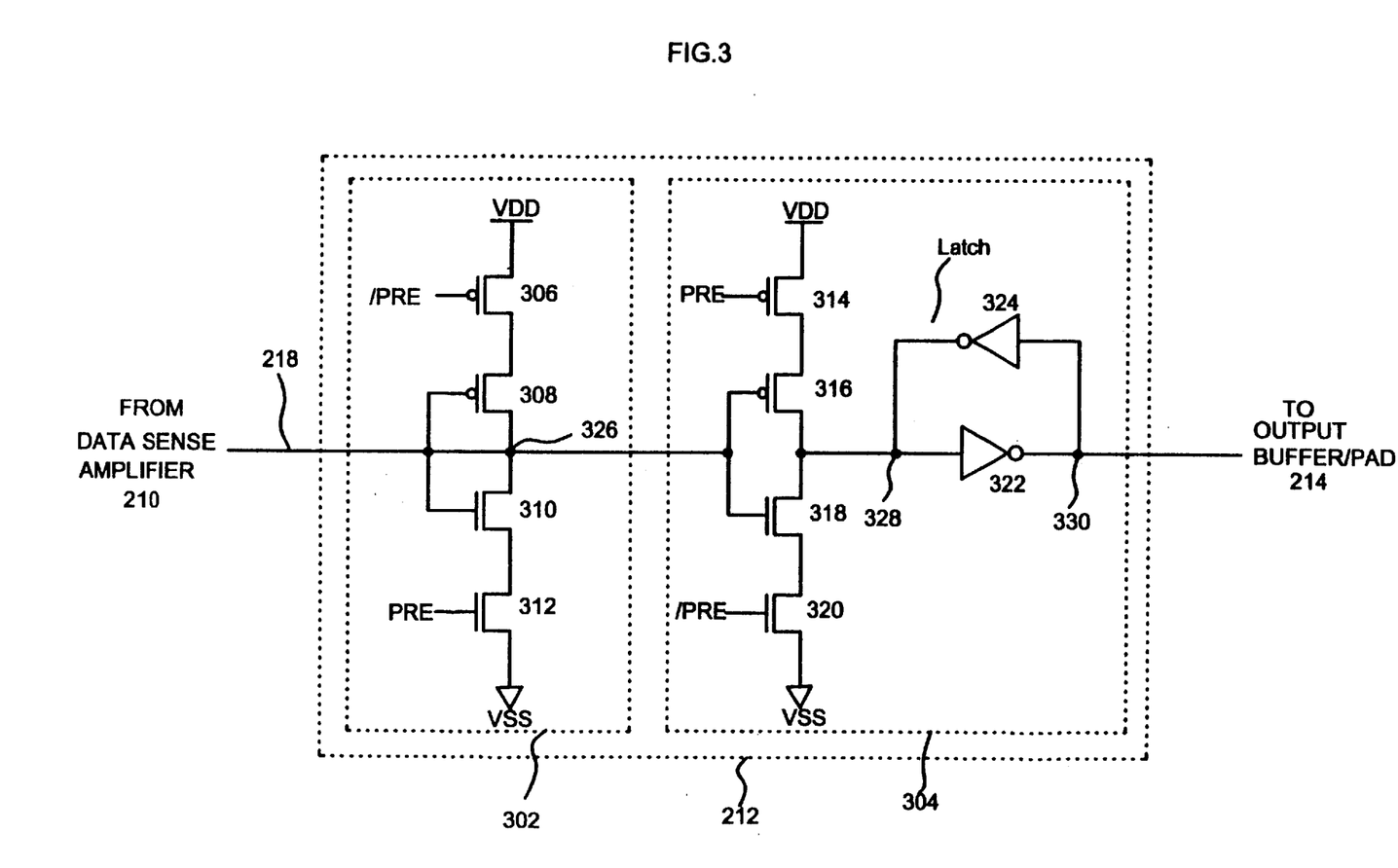
FIG. 3 is a diagram of a data bus precharge circuit of a semiconductor memory according to the present invention.
Figure 4:
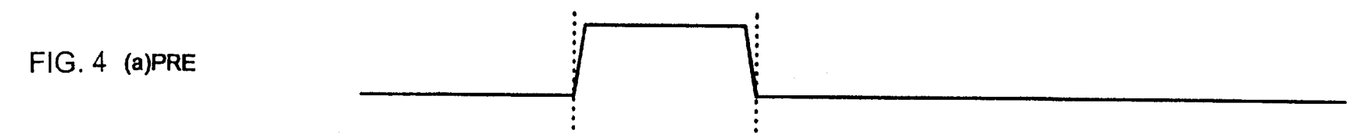
FIGS. 4(a)–4(e) are a timing diagram of operational characteristics of the data bus precharge circuit according to the present invention.

FIG. 3 shows a data bus precharge circuit of a semiconductor memory according to the present invention. The data bus precharge circuit 212 of FIG. 3 includes a voltage distribution circuit 302 and a logic signal generation circuit 304. In the voltage distribution circuit 302, a couple of PMOS transistors 306 and 308 and a couple of NMOS transistors 310 and 312 are connected in series between power source voltage VDD and ground voltage VSS. The PMOS transistor 306 is controlled by a precharge bar signal /PRE, while the NMOS transistor 312 is controlled by a precharge signal PRE. The precharge signal PRE and the precharge bar signal /PRE are complementary signals. Each drain and gate of the other PMOS and NMOS transistors 308 and 310 is connected to a node 326 of the data bus 218. Thus, the PMOS and NMOS transistors 308 and 310 work as passive devices and have the same turn-on resistance. When the precharge signal PRE is on high level (/PRE is at low level), the PMOS and NMOS transistors 306 and 312 are turned on and the voltage at the node 326 becomes VDD/2 (half VDD). When the precharge signal PRE is on low level (/PRE is at high level), the PMOS and NMOS transistors 306 and 312 are turned off and the node 326 is floated.

In the logic signal generation circuit 304, a couple of PMOS transistors 314 and 316 and a couple of NMOS transistors 318 and 320 are connected in series between the power source voltage VDD and ground voltage VSS. The PMOS transistor 314 is controlled by a precharge signal PRE, while the NMOS transistor 320 is controlled by a precharge bar signal /PRE. The PMOS and NMOS transistors 316 and 318 are controlled by the voltage at the node 326 which is a signal of the data bus 218. Each drain of the PMOS and NMOS transistors 316 and 318 is connected to a node 328 of a data bus 330.

While the precharge is carried out (PRE is at high level), the PMOS and NMOS transistors 314 and 320 are turned off and the data buses 218 and 330 open. The PMOS and NMOS transistors 314 and 320 are turned on after the completion of the precharge (PRE is at low level), thereby having a signal which is an inverted signal of the other node 326 at the node 328 of the data bus 218. The voltage at the node 328 of the data bus 218, which having an improved driving capacitance, is transferred to the data output buffer 214 through the data bus 330. An output of an inverter 322 is inverted by another inverter 324, to be fed back as its input, thereby latching a logic value of the present output signal.

FIGS. 4(a)–4(e) show a precharge signal PRE, a data bus sense amplifier output enabling signal, an output signal of a data bus sense amplifier, a data signal at a node 326 of the data bus 218, and a signal at a node 330 of the data bus 218, respectively. Referring to FIGS. 4(a)–4(e), a precharge signal PRE maintains a high level for a predetermined time and then changes to a low level before a data bus sense amplifier output enabling signal is activated to a high level (precharge section). In the precharge section, the data bus 218 is precharged to voltage level of VDD/2 as well as the nodes 326 and 328 in FIG. 3, and becomes open.

Accordingly, the inverter 322 outputs the logic value of the previous data signal DATA1. After the precharge section elapses and the data bus sense amplifier amplifies the signal to high level, the data bus sense amplifier generates a new data signal DATA2. In this case, the new data signal DATA2 show up at the node 328 of the data bus 218 as well as at the other node 330 as an output terminal of the inverter 322.

Figure 5:
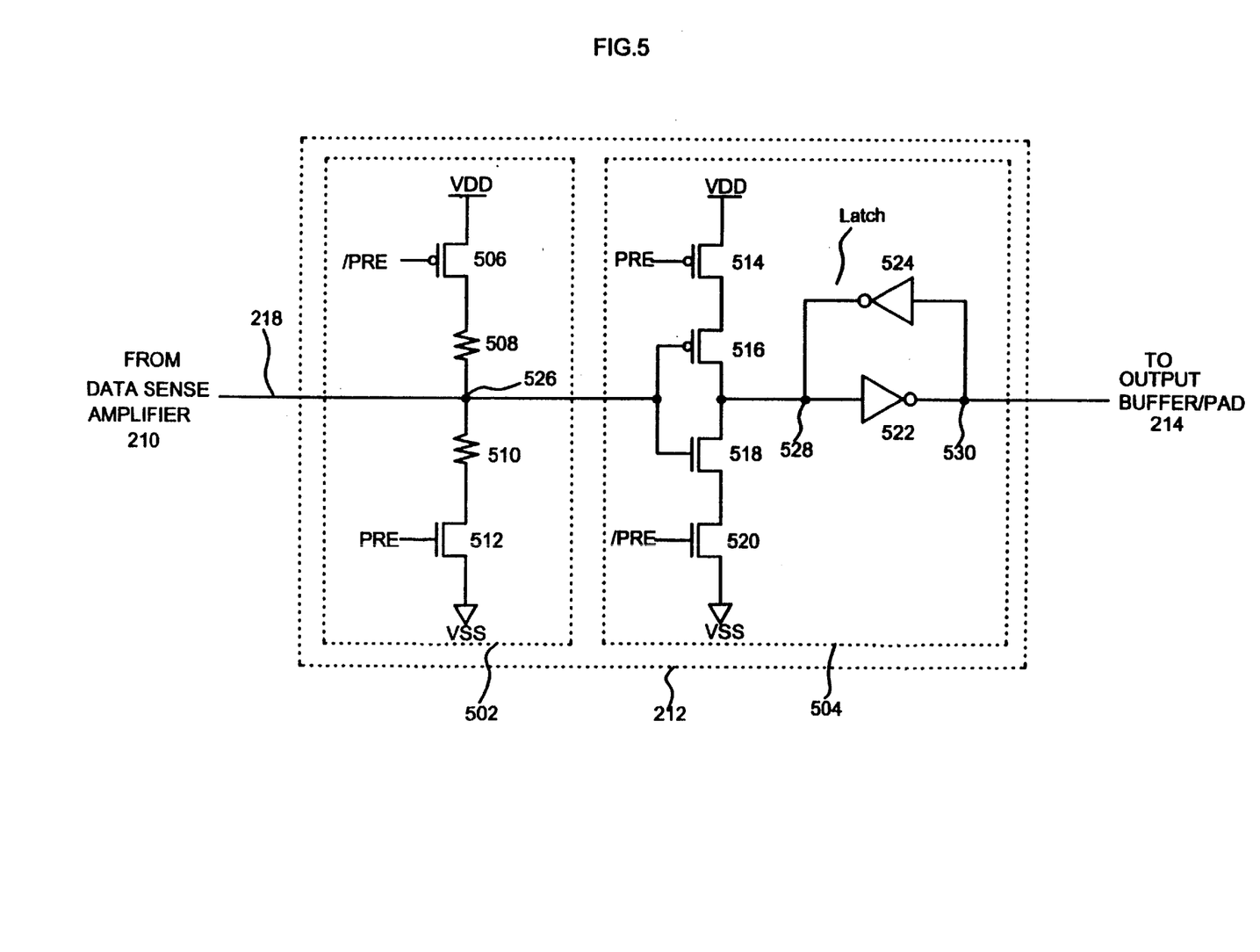
FIG. 5 is a diagram of a data bus precharge circuit of a semiconductor memory according to another embodiment of the present invention.

FIG. 5 shows a data bus precharge circuit of a semiconductor memory according to another embodiment of the present invention. Referring to FIG. 5, a voltage distribution circuit 502 may be constructed with a voltage drop means comprising resistors 508 and 510 as passive devices. If the resistors 508 and 510 are identical in size, the node 526 of the data bus 218 is precharged to voltage level of VDD/2 since the power source voltage VDD is dropped to half of its value by the resistor 508.

Figure 6:
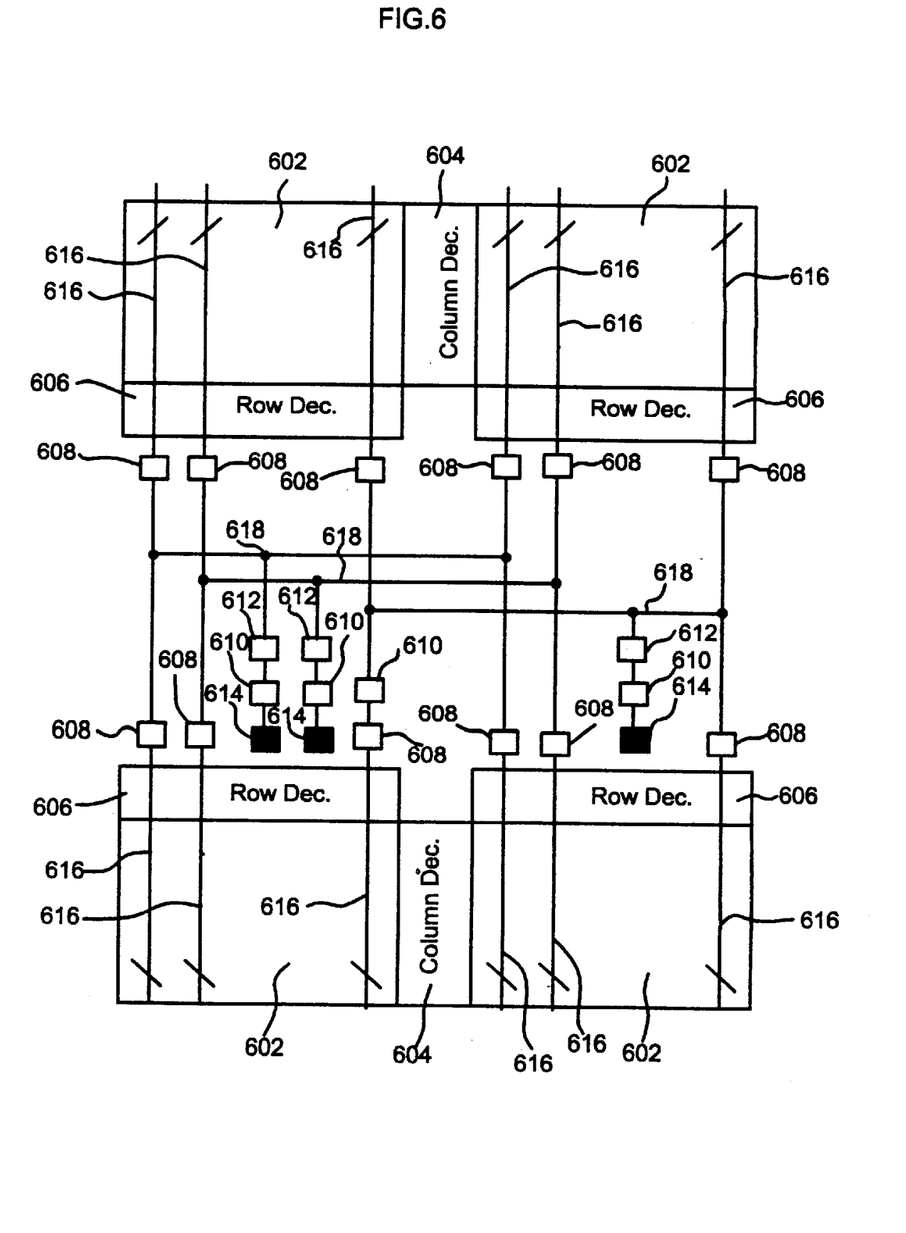
FIG. 6 is a block diagram of a semiconductor memory according to a second embodiment of the present invention.

FIG. 6 shows a block diagram of a semiconductor memory according to another embodiment of the present invention. Four I/O line sense amplifiers 608 are equipped with a single data bus sense amplifier 610 in another embodiment of the present invention shown in FIG. 6, while data bus sense amplifiers 210 are installed in the I/O line sense amplifiers 208 in the embodiment of the present invention shown in FIG. 2. Outputs of the I/O line sense amplifiers 608 of I/O lines are connected to the I/O line 616 that is connected to a bit line of the same address in each of the memory cell arrays 602 and are transferred to the single data bus precharge circuit 612 through a single data bus 618. Also, outputs of the four I/O line sense amplifiers 608 have the single data bus 618 in common in FIG. 6.

The semiconductor memory according to FIG. 6 is constructed with four memory cell arrays 602. Each memory cell array has one row decoder 606, and a column decoder 604 is co-owned by two memory cell arrays 602 that are adjacent to each other. The column decoder 604 selects a corresponding bit line of the respective memory cell arrays 602 by decoding the inputted column address. Each of the memory cell arrays is constructed with a plurality of memory cells. One of the memory cells is selected by the column decoder 604 and the row decoder 606. A data signal of the selected memory cell is transferred to an I/O line 616 through a bit line. Each of the I/O lines 616 is connected to each of I/O line sense amplifiers 608. The I/O line sense amplifier 608 connects or disconnects the I/O line 616 to or from the data bus precharge circuit 612 and amplifies the data signal carried on the I/O line 616.

The data bus precharge circuit 612 precharges the data bus 618 to the level of VDD/2 before a data signal is outputted from the I/O line sense amplifier 608. Once an output of the data signal is generated from the data bus sense amplifier 608, the data bus precharge circuit 612 transfers the voltage of the data bus 618 to high or low level in accordance with the level of the data signal. All of the data bus precharge circuits 612 are equipped with data bus sense amplifiers 610 that amplifies the data signal outputted from the data bus precharge circuit 612. A data output buffer/pad 614 is constructed with a data output buffer and a data output pad. The data output buffer/pad 614 improves the driving capacity of the data signal outputted from the data bus precharge circuit 612 so that it is enough to an external chip voltage level to be outputted outside the chip.

A semiconductor memory according to the present invention improves the speed of data outputting by transferring promptly a data bus signal to high or low level as soon as an output of a data signal occurs by means of precharging the data bus at a predetermined voltage level before the generation of the output of the data signal, wherein a data bus precharge signal is installed in the data bus connected to a data bus output buffer.

It will be apparent to those skilled in the art that various modifications and variations can be made in a semiconductor memory of the present invention without departing from the spirit or scope of the inventions. Thus, it is intended that the present invention cover the modifications and variations of this invention provided they come within the scope of the appended claims and equivalents.

What is claimed is:

1. A semiconductor memory, comprising:
    a memory cell array including a plurality of memory cells, wherein each of the plurality of memory cells outputs a first data signal through an I/O line;
    an I/O line driving circuit for generating a second data signal by amplifying the first data signal, wherein the I/O line driving circuit is connected to the I/O lines;
    a data bus driving circuit connected to the I/O line driving circuit to generate a third data signal by amplifying the second data signal;
    a data bus precharge circuit; and
    a data bus connecting the data bus driving circuit to the data bus precharge circuit, wherein the data bus precharge circuit precharges the data bus to a predetermined voltage level before the third data signal is generated and transfers a voltage of the data bus to high or low level in accordance with a logic value of the third data signal when the third data signal is generated.

2. The semiconductor memory according to claim 1, wherein each of the plurality of memory cells includes a plurality of the I/O lines, and each of the plurality of the I/O line in the each of the plurality of memory cells is connected to the I/O line driving circuit and the data bus driving circuit, wherein one of the data bus driving circuit connected to one of the plurality of the I/O lines in each of the plurality of memory cells is connected to the single data bus.

3. The semiconductor memory according to claim 1, wherein the data bus precharge circuit further includes:
    a voltage distribution circuit precharging a first node of the data bus at a predetermined voltage level and floating the first node after the precharging is completed; and
    a logic signal generation circuit having the first node and a second node of the data bus open during the precharge and inverting a signal of the first node that is to be inputted to the second node after the precharging is completed, wherein the logic signal generation circuit latches a logic value of a data signal of the second node.

4. The semiconductor memory according to claim 1, wherein the data bus precharge circuit further includes:
    a voltage distribution circuit including a first switch, a first resistor, a second resistor, and a second switch connected in series between a power source voltage and a ground, the first and second resistors being connected to a first node of the data bus, and the voltage distribution circuit precharging the first node to a predetermined voltage level distributed by the first and second resistors when the first and second switches are turned on during the precharging and the first node floats after the precharging is completed; and a logic signal generation circuit having third to sixth switches connected in series between a power source voltage and a ground, the third and sixth switches being controlled by the precharge signal, and the fourth and fifth switches connected to a second node of the data bus being controlled by a voltage of the first node, wherein the first and second nodes are open and the third and sixth switches are turned off during the precharging, and after the precharging is completed, the third and sixth switches are turned on, an inverted signal of the first node shows up at the second node, and a data signal of the second node is amplified by a first inverter to be outputted to the data output buffer by feeding back an output of the first inverter to the first inverter by a second inverter.

5. A semiconductor memory, comprising:

a memory cell array including a plurality of memory cells, wherein each of the plurality of memory cells outputs a first data signal through an I/O line;

an I/O line driving means for generating a second data signal by amplifying the first data signal, wherein the I/O line driving means is connected to the I/O lines;

a data bus driving means connected to the I/O line driving means to generate a third data signal by amplifying the second data signal;

a data bus precharge means; and a data bus connecting the data bus driving means to the data bus precharge means, wherein the data bus precharge means precharges the data bus to a predetermined voltage level before the third data signal is generated and transfers a voltage of the data bus to high or low level in accordance with a logic value of the third data signal when the third data signal is generated.

6. The semiconductor memory according to claim 5, wherein each of the plurality of memory cells includes a plurality of the I/O lines, and each of the plurality of the I/O line in the each of the plurality of memory cells is connected to the I/O line driving means and the data bus driving means, wherein one of the data bus driving means connected to one of the plurality of the I/O lines in each of the plurality of memory cells is connected to the single data bus.

7. The semiconductor memory according to claim 5, wherein the data bus precharge means further includes:

a voltage distribution means precharging a first node of the data bus at a predetermined voltage level and floating the first node after the precharging is completed; and a logic signal generation means having the first node and a second node of the data bus open during the precharge and inverting a signal of the first node that is to be inputted to the second node after the precharging is completed, wherein the logic signal generation means latches a logic value of a data signal of the second node.

8. The semiconductor memory according to claim 5, wherein the data bus precharge means further includes:

a voltage distribution means including a first switching means, a first resistor, a second resistor, and a second switching means connected in series between a power source voltage and a ground, the first and second resistors being connected to a first node of the data bus, and the voltage distribution means precharging the first node to a predetermined voltage level distributed by the first and second resistors when the first and second switching means are turned on during the precharging and the first node floats after the precharging is completed; and a logic signal generation means having third to sixth switching means connected in series between a power source voltage and a ground, the third and sixth switching means being controlled by the precharge signal, and the fourth and fifth switching means connected to a second node of the data bus being controlled by a voltage of the first node, wherein the first and second nodes are open and the third and sixth switching means are turned off during the precharging, and after the precharging is completed, the third and sixth switching means are turned on, an inverted signal of the first node shows up at the second node, and a data signal of the second node is amplified by a first inverter to be outputted to the data output buffer by feeding back an output of the first inverter to the first inverter by a second inverter.

9. A semiconductor memory, comprising:

a memory cell array including a plurality of memory cells, wherein each of the plurality of memory cells outputs a first data signal through an I/O line;

an I/O line driving circuit for generating a second data signal by amplifying the first data signal;

a data bus precharge circuit;

a data bus connecting the I/O line driving circuit to the data bus precharge circuit, wherein the data bus precharge circuit precharges the data bus to a predetermined voltage level before the second data signal is generated and transfers a voltage of the data bus to high or low level in accordance with a logic value of the second data signal when the second data signal is generated; and a data bus driving circuit connected to the data bus precharge circuit generating a third data signal by amplifying a data signal outputted from the data bus precharge circuit.

10. The semiconductor memory according to claim 9, wherein each of the plurality of memory cells includes a plurality of the I/O lines, and each of the plurality of the I/O line in the each of the plurality of memory cells is connected to the I/O line driving circuit, wherein one of the I/O line driving circuit connected to one of the plurality of the I/O lines in each of the plurality of memory cells is connected to the single data bus and the single data bus driving circuit.

11. The semiconductor memory according to claim 9, wherein the data bus precharge circuit further includes:

a voltage distribution circuit for precharging a first node of the data bus to a predetermined voltage level and floating the first node after the precharging is completed; and a logic signal generation circuit having the first node and a second node of the data bus open during the precharge and inverting a signal of the first node that is to be inputted to the second node after the precharging is completed, wherein the logic signal generation circuit latches a logic value of a data signal of the second node.

12. The semiconductor memory according to claim 9, wherein the data bus precharge circuit further includes:

a voltage distribution circuit including a first switch, a first resistor, a second resistor, and a second switch connected in series between a power source voltage and a ground, the first and second resistors being connected to a first node of the data bus, and the voltage distribution circuit precharging the first node to a voltage level distributed by the first and second resistors when the first and second switches are turned on during the precharging and the first node floats after the precharging is completed; and a logic signal generation circuit having third to sixth switches connected in series between a power source voltage and a ground, the third and sixth switches being controlled by the precharge signal, and the fourth and fifth switches connected to a second node of the data bus being controlled by a voltage of the first node,
wherein the first and second nodes are open and the third and sixth switches are turned off during the precharging, and after the precharging is completed, the third and sixth switches are turned on, an inverted signal of the first node shows up at the second node, and a data signal of the second node is amplifiedoby a first inverter to be outputted to the data output buffer by feeding back an output of the first inverter to the first inverter by a second inverter.

13. A semiconductor memory, comprising:
a memory cell array including a plurality of memory cells, wherein each of the plurality of memory cells outputs a first data signal through an I/O line;
an I/O line driving means for generating a second data signal by amplifying the first data signal;
a data bus precharge means;
a data bus connecting the I/O line driving means to the data bus precharge means,
wherein the data bus precharge means precharges the data bus to a predetermined voltage level before the second data signal is generated and transfers a voltage of the data bus to high or low level in accordance with a logic value of the second data signal when the second data signal is generated; and
a data bus driving means connected to the data bus precharge means generating a third data signal by amplifying a data signal outputted from the data bus precharge means.

14. The semiconductor memory according to claim 13, wherein each of the plurality of memory cells includes a plurality of the I/O lines, and each of the plurality of the I/O line in the each of the plurality of memory cells is connected to the I/O line driving means, wherein one of the I/O line driving means connected to one of the plurality of the I/O lines in each of the plurality of memory cells is connected to the single data bus and the single data bus driving means.

15. The semiconductor memory according to claim 13, wherein the data bus precharge means further includes:
a voltage distribution means precharging a first node of the data bus at a predetermined voltage level and floating the first node after the precharging is completed; and
a logic signal generation means having the first node and a second node of the data bus open during the precharge and inverting a signal of the first node that is to be inputted to the second node after the precharging is completed, wherein the logic signal generation means latches a logic value of a data signal of the second node.

16. The semiconductor memory according to claim 13, wherein the data bus precharge means further includes:
a voltage distribution means including a first switch, a first resistor, a second resistor, and a second switch connected in series between a power source voltage and a ground, the first and second resistors being connected to a first node of the data bus, and the voltage distribution means precharging the first node to a voltage level distributed by the first and second resistors when the first and second switches are turned on during the precharging and the first node floats after the precharging is completed; and a logic signal generation means having third to sixth switches connected in series between a power source voltage and a ground, the third and sixth switches being controlled by the precharge signal, and the fourth and fifth switches connected to a second node of the data bus being controlled by a voltage of the first node,
wherein the first and second nodes are open and the third and sixth switches are turned off during the precharging, and after the precharging is completed, the third and sixth switches are turned on, an inverted signal of the first node shows up at the second node, and a data signal of the second node is amplified by a first inverter to be outputted to the data output buffer by feeding back an output of the first inverter to the first inverter by a second inverter.

17. A data bus precharge circuit, comprising:
a voltage distribution circuit including a first switch, a first resistor, a second resistor, and a second switch connected in series between a power source voltage and a ground, the first and second resistors being connected to a first node of the data bus, and the voltage distribution circuit precharging the first node to a voltage level distributed by the first and second resistors when the first and second switches are turned on during the precharging and the first node floats after the precharging is completed; and a logic signal generation circuit having third to sixth switches connected in series between a power source voltage and a ground, third and sixth switches being controlled by the precharge signal, and the fourth and fifth switches connected to a second node of the data bus being controlled by a voltage of the first node,
wherein the first and second nodes are open and the third and sixth switches are turned off during the precharging, and after the precharging is completed, the third and sixth switches are turned on, an inverted signal of the first node shows up at the second node, and a data signal of the second node is amplified by a first inverter to be outputted to the data output buffer by feeding back an output of the first inverter to the first inverter by a second inverter.

* * * * *